United States Patent
Liang et al.

(10) Patent No.: US 8,255,177 B2
(45) Date of Patent: Aug. 28, 2012

(54) SYSTEM AND METHOD FOR CALIBRATING OSCILLOGRAPH CHANNELS

(75) Inventors: Hsien-Chuan Liang, Taipei Hsien (TW); Shen-Chun Li, Taipei Hsien (TW); Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 315 days.

(21) Appl. No.: 12/752,145

(22) Filed: Apr. 1, 2010

(65) Prior Publication Data

US 2011/0098955 A1 Apr. 28, 2011

(30) Foreign Application Priority Data

Oct. 23, 2009 (CN) .......................... 2009 1 0308718

(51) Int. Cl.
*G01R 13/02* (2006.01)

(52) U.S. Cl. ....................................................... 702/68
(58) Field of Classification Search ...................... 702/68
See application file for complete search history.

(56) References Cited

U.S. PATENT DOCUMENTS

2006/0176994 A1* 8/2006 Miller et al. .................. 375/376

* cited by examiner

*Primary Examiner* — Tung S Lau
(74) *Attorney, Agent, or Firm* — Altis Law Group, Inc.

(57) ABSTRACT

A system and method for calibrating oscillograph channels assigns the same value to a drawing parameter of each channel. Each channel receives a signal sent by a signal generator. The oscillograph calculates a voltage difference between a standard signal voltage of a standard channel defined by a user and a signal voltage of each of the other channels. A sequence relationship between each of the other channels and the standard channel is determined. The oscillograph adjusts a deskew value of each of the other channels until each voltage difference is in an allowable range according to the sequence relationship.

12 Claims, 4 Drawing Sheets

SYSTEM AND METHOD FOR CALIBRATING OSCILLOGRAPH CHANNELS

BACKGROUND

1. Technical Field

Embodiments of the present disclosure relate to channel calibration, and more particularly to a system and a method for calibrating oscillograph channels.

2. Description of Related Art

Generally, different oscillograph channels may obtain different signal voltages when the channels measure signals. At present, deskew values of the channels require manual adjustment, thus consuming a lot of time.

What is needed, therefore, is an improved system and method for calibrating oscillograph channels.

DETAILED DESCRIPTION

The processes described may be embodied in, and fully automated via, functional modules executed by one or more general purpose processors. The functional modules may be stored in any type of computer-readable medium or other computer storage device. Some or all of the methods may alternatively be embodied in specialized computer hardware or communication apparatus.

Figure 1:
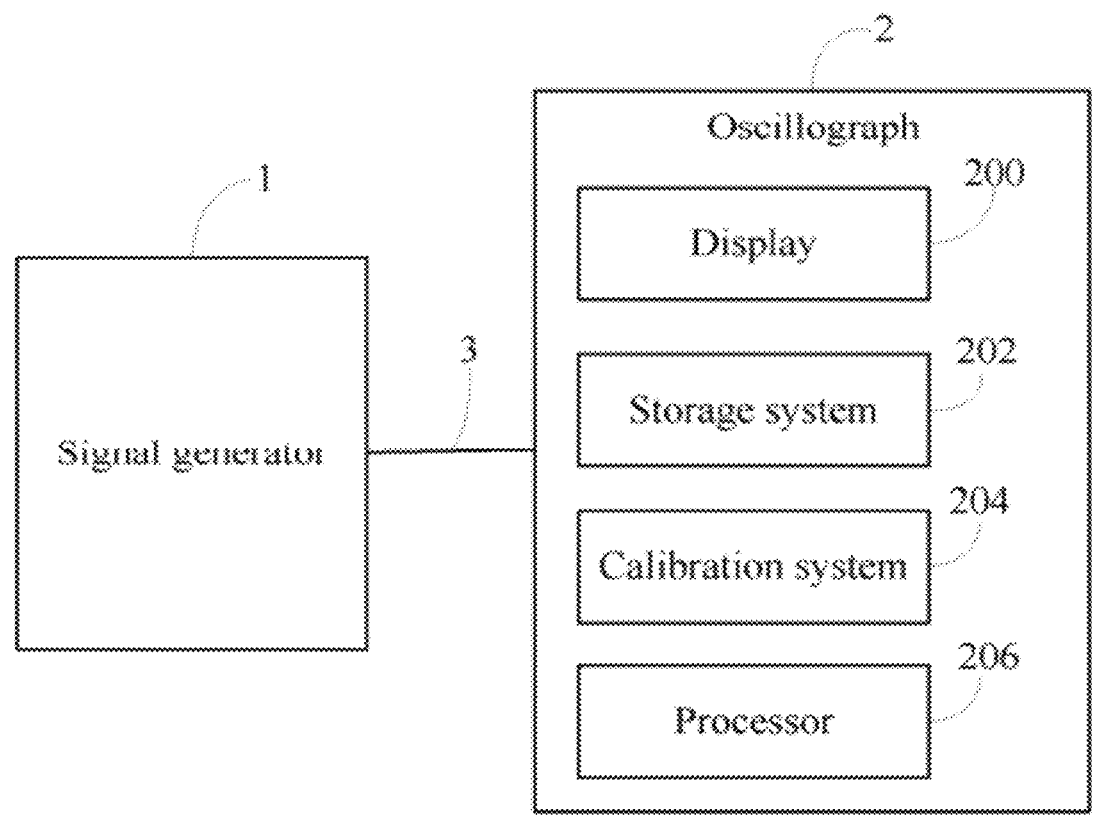
FIG. 1 is a block diagram of one embodiment of an oscillograph comprising a calibration system.

FIG. 1 is a block diagram of one embodiment of an oscillograph 2 comprising a calibration system 204. The calibration system 204 may be used to calibrate channels of the oscillograph 2. The oscillograph 2 includes a display 200 and a plurality of channels (not shown). Each channel connects to a sounding rod 3. The channels of the oscillograph 2 receive signals sent by a signal generator 1 via sounding rods 3. The channels measure signal voltages of the signals. The display 200 displays waveform charts of the signal voltages.

The oscillograph 2 further includes a processor 206 and a storage system 202. The processor 206 executes one or more computerized operations of the oscillograph 2 and other applications, providing function. The storage system 202 stores one or more programs and various data. In one embodiment, the storage system 202 stores an allowable range of voltage differences between signal voltages of channels.

Figure 2:
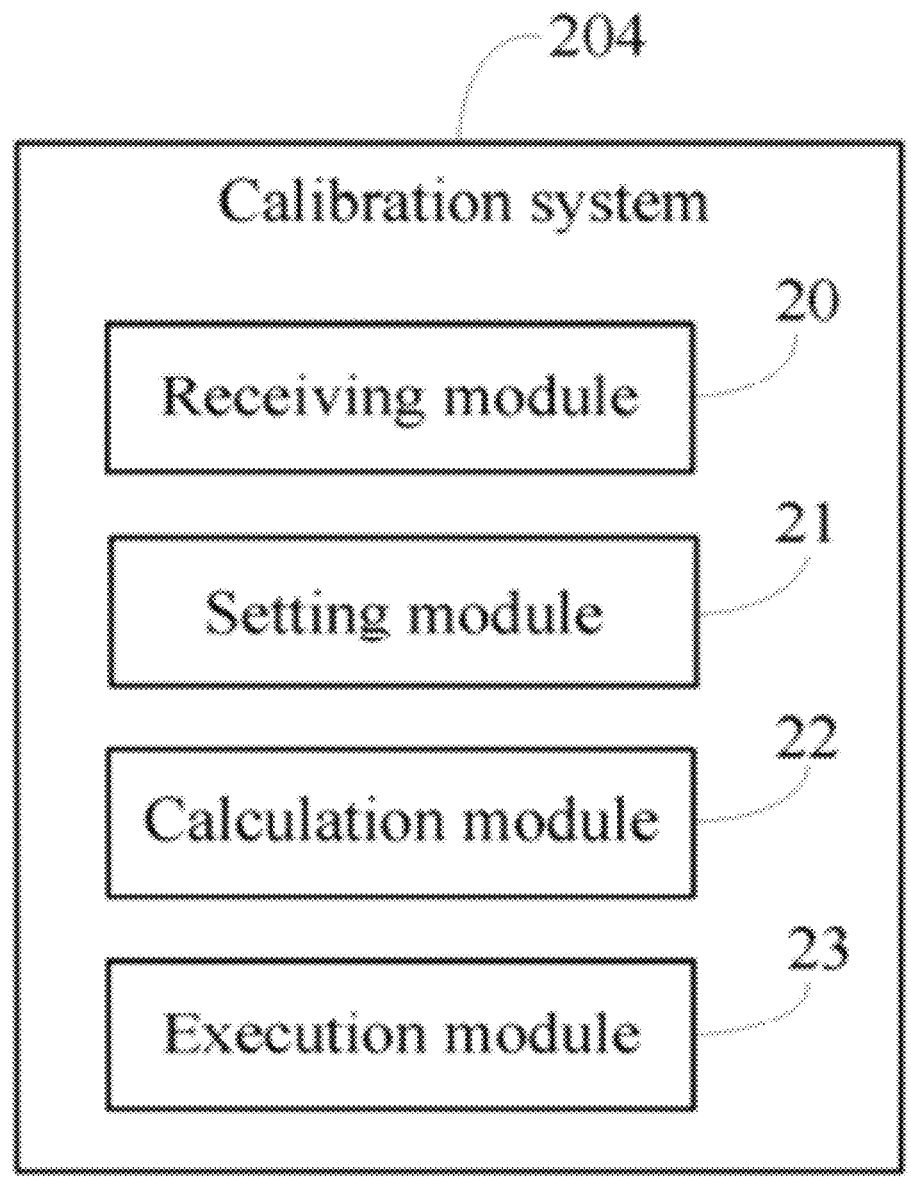
FIG. 2 is a block diagram showing functional modules of the calibration system of FIG. 1.

FIG. 2 is a block diagram showing functional modules of the calibration system 204 of FIG. 1. In one embodiment, the calibration system 204 may include a receiving module 20, a setting module 21, a calculation module 22, and an execution module 23. It may be understood that the processor 206 may be used to execute one or more computerized codes of the functional modules 20-23. The one or more computerized codes of the functional modules 20-23 may be stored in the storage system 202.

The receiving module 20 receives channels selected by a user and determines if the number of channels is less than two. If so, the receiving module 20 prompts reselection of the channels.

The setting module 21 initializes the channels selected by the user if the number of channels is not less than two. The setting module 21 assigns the same value to a drawing parameter of each of the initialized channels. The drawing parameter may include a unit length of a time axis of the waveform chart, a translation amount, a trigger level, and a deskew value of each channel, for example. In one embodiment, an initial value of the deskew value is set as zero. For example, the oscillograph 2 may include a first channel, a second channel, a third channel, and a fourth channel. If the first and third channels are selected, the setting module 21 starts first and third channels and assigns the same value to a drawing parameter of the first channel and the drawing parameter of the third channel.

The receiving module 20 directs each initialized channel to receive a signal from the signal generator 1. Each initialized channel measures a signal voltage of the signal. The receiving module 20 displays a waveform chart of the signal voltage of the signal measured by each initialized channel according to the drawing parameters.

The calculation module 22 determines an initialized channel as a standard channel and calculates a voltage difference between a standard signal voltage of the standard channel and the signal voltage of each of the other initialized channels. The calculation module 22 determines a sequence relationship between each of the other initialized channels and the standard channel measuring the signal at the same time according to the calculated voltage difference. If the voltage difference between the standard channel and one of the other initialized channels is a positive number, the calculation module 22 determines that the one of the other initialized channels lags behind the standard channel. If the voltage difference is a negative number, the calculation module 22 determines that the other channel measuring the signal is earlier than the standard channel.

Figure 4:
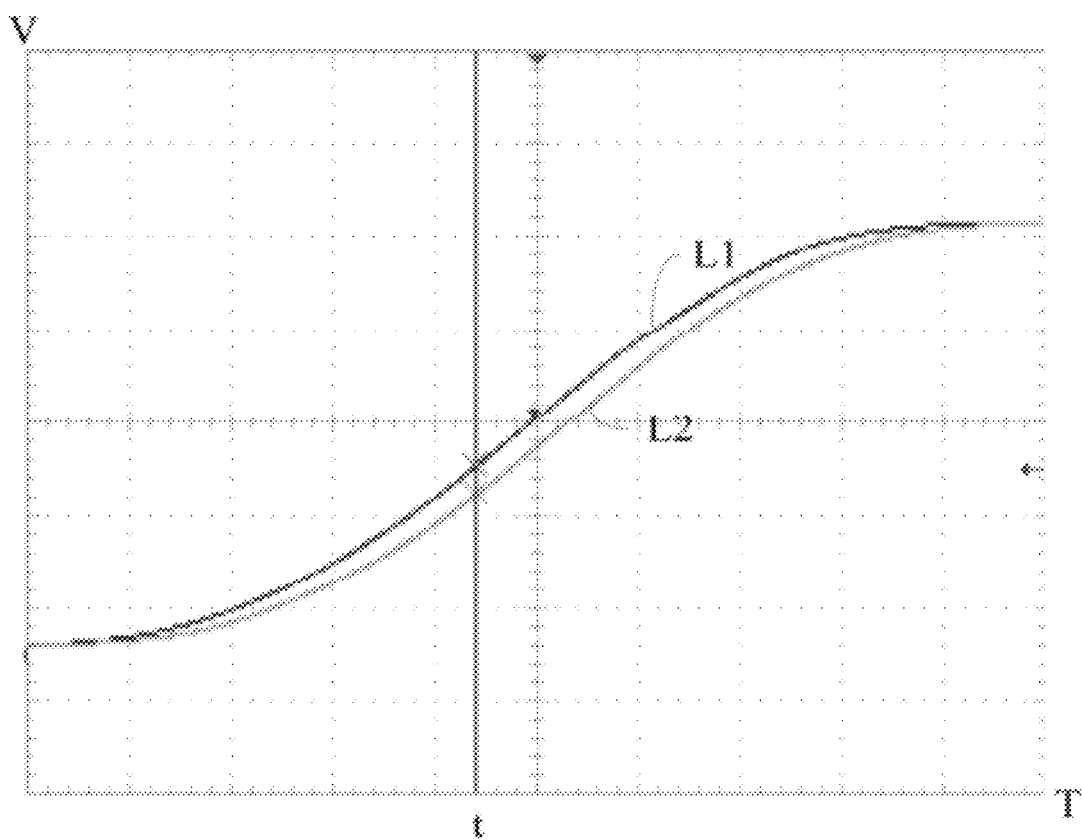
FIG. 4 is a waveform chart of signal voltages measured by the oscillograph channels.

As shown in FIG. 4, the abscissa of the coordinates system denotes time. The ordinate of the coordinates system denotes signal voltage. The curve L1 is the waveform chart of the signal voltages measured by the first channel. The curve L2 is the waveform chart of the signal voltages measured by the third channel. If the first channel is defined as the standard channel, the voltage difference between the standard signal voltage and the signal voltage measured by the third channel at the time "t" is a positive number. Then the calculation module 22 determines that the third channel lags behind from the first channel.

The calculation module 22 determines if each voltage difference is in the allowable range stored in the storage system 202. The execution module 23 adjusts the deskew value of a channel in a predefined value according to the sequence relationship between the other initialized channels and the standard channel if the voltage difference between the channel and the standard channel is not in the allowable range. In one embodiment, the predefined value may be 3 ps (picosecond). As shown in FIG. 4, the third channel lags behind the standard channel, such as the first channel. The execution module 23 adds the deskew value of the curve L2 by 3 ps, so that the time of measured the signal by the third channel is advanced. The execution module 23 outputs the deskew value of each of the other initialized channels if each voltage difference is in the allowable range.

Figure 3:
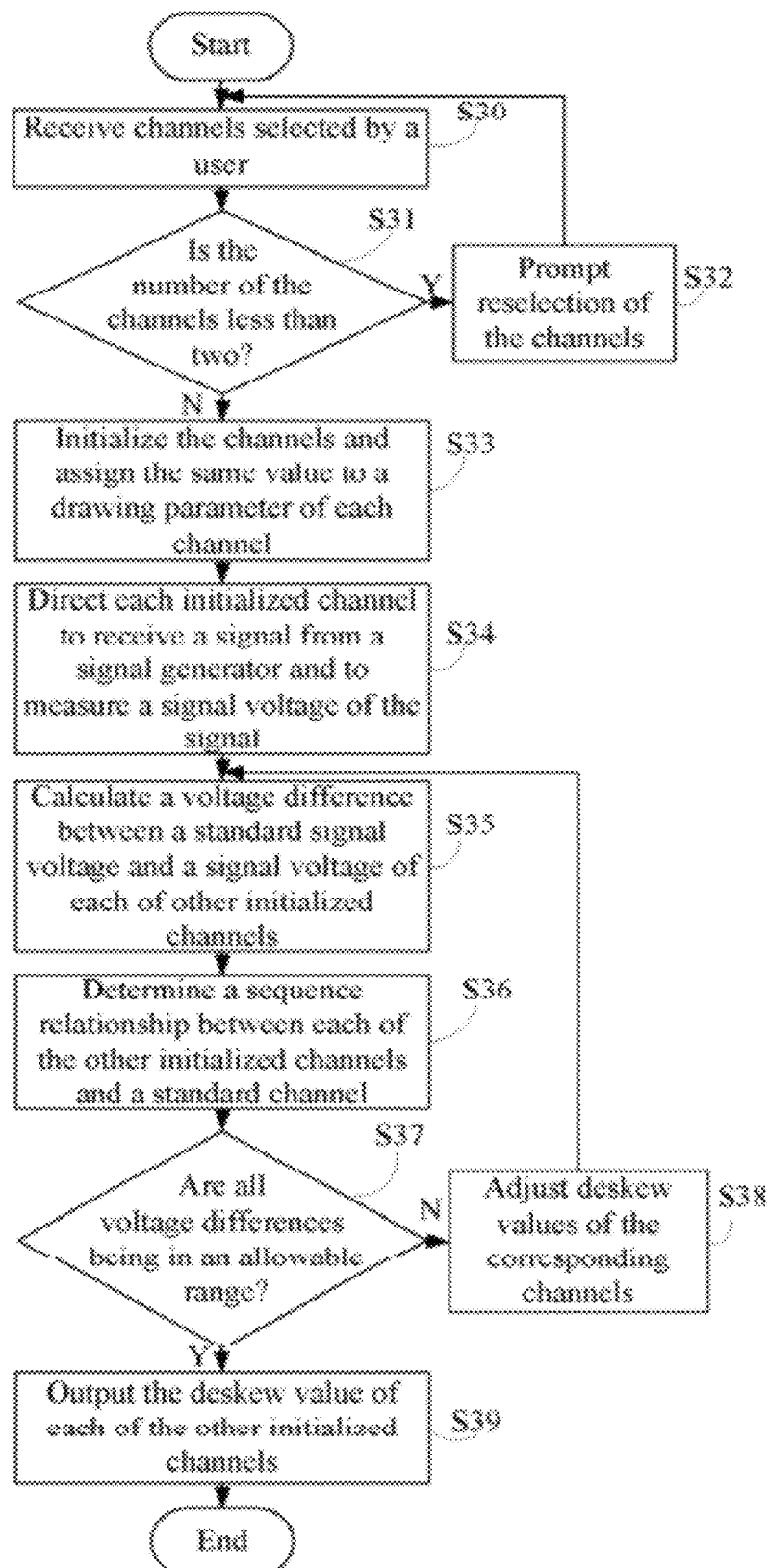
FIG. 3 is a flowchart of one embodiment of a method for calibrating oscillograph channels.

FIG. 3 is a flowchart of one embodiment of a method for calibrating oscillograph channels.

In block S30, the receiving module 30 receives channels selected by a user.

In block S31, the receiving module 31 determines if the number of channels is less than two. If the number of the channels is less than two, block S32 is implemented. If the number of the channels is not less than two, block S33 is implemented.

In block S32, the receiving module prompts reselection of the channels, and block S30 is repeated.

In block S33, the setting module 21 initializes the channels selected by the user, and assigns the same value to a drawing parameter of each channel. The drawing parameters may include a unit length of a time axis of the waveform chart, a translation amount, a trigger level, and a deskew value of each channel. In one embodiment, an initial value of the deskew value is set as zero.

In block S34, the receiving module 20 directs each initialized channel to receive a signal from the signal generator 1. Each channel measures a signal voltage of the signal. The receiving module 20 displays a waveform chart of the signal voltage of the signal measured by each initialized channel according to the drawing parameters.

In block S35, the calculation module 22 determines a initialized channel as a standard channel and calculates a voltage difference between a standard signal voltage of the standard channel and the signal voltage of each of the other initialized channels.

In block S36, the calculation module 22 determines a sequence relationship between each of the other initialized channels and the standard channel measuring the signal at the same time according to the calculated voltage difference.

In block S37, the calculation module 22 determines if each voltage difference is in the allowable range stored in the storage system 202. If a voltage difference is not in the allowable range, block S38 is implemented. If the voltage difference is in the allowable range, block S39 is implemented.

In block S38, the execution module 23 adjusts the deskew value of each of the other initialized channels corresponding to the voltage difference in a predefined value according to the sequence relationship between each of the other initialized channels and the standard channel.

In block S39, the execution module 23 outputs the deskew value of each of the other initialized channels if each voltage difference is in the allowable range.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A system for calibrating oscillograph channels, the oscillograph in communication with a signal generator, the system comprising:
a storage system; and
at least one processor to execute one or more programs stored in the storage system, the one or more programs comprising:
a setting module operable to initialize channels selected by a user, and assign the same value to a drawing parameter of each of the initialized channels;
a receiving module operable to direct each initialized channel to receive a signal from the signal generator and measure a signal voltage of the signal, and display a waveform chart of the signal voltage according to the drawing parameter;
a calculation module operable to determine an initialized channel as a standard channel, calculate a voltage difference between a standard signal voltage of the standard channel and a signal voltage of each of the other initialized channels, and determine a sequence relationship between each of the other initialized channels and the standard channel measuring the signal at the same time according to the calculated voltage difference; and
an execution module operable to adjust a deskew value of each of the other initialized channels according to the sequence relationship until each voltage difference is in an allowable range, and output the deskew value of each of the other initialized channels.

2. The system of claim 1, wherein the receiving module is further operable to determine if a number of channels selected by the user is less than two, and prompt reselection of channels if the number is less than two.

3. The system of claim 1, wherein the drawing parameter comprises a unit length of a time axis of the waveform chart, a translation amount, a trigger level, and a deskew value of each of the other initialized channels.

4. The system of claim 1, wherein the calculation module is further operable to determine that a channel measuring the signal is earlier than the standard channel if the voltage difference between the channel and the standard channel is a positive number, and determine that channels lags behind the standard channel if the voltage difference is a negative number.

5. A computer-based method for calibrating oscillograph channels, the method comprising:
initializing channels selected by a user;
assigning the same value to a drawing parameter of each of the initialized channels;
directing each initialized channel to receive a signal from a signal generator and measure a signal voltage of the signal, displaying a waveform chart of the signal voltage of the signal according to the drawing parameter;
determining a initialized channel as a standard channel, calculating a voltage difference between a standard signal voltage of the standard channel and a signal voltage of each of the other initialized channels;
determining a sequence relationship between each of the other initialized channels and the standard channel measuring the signal at the same time according to the calculated voltage difference; and
adjusting a deskew value of each of the other initialized channels according to the sequence relationship until each voltage difference is in an allowable range, and outputting the deskew value of each of the other initialized channels.

6. The method of claim 5, further comprising, after initializing channels selected by a user:
determining if a number of channels selected by the user is less than two, and
prompting the user to reselect channels if the number is less than two.

7. The method of claim 5, wherein the drawing parameter comprises a unit length of a time axis of the waveform chart, a translation amount, a trigger level, and a deskew value of each of the other initialized channels.

8. The method of claim 5, wherein determination of a sequence relationship between each of the other initialized channels and the standard channel comprises:
determining that a channel measuring the signal is earlier than the standard channel if the voltage difference between the channel and the standard channel is a positive number; and
determining that the channel lags behind the standard channel if the voltage difference is a negative number.

9. A medium having stored therein instructions that, when executed by an oscillograph, causing the oscillograph to perform a method for calibrating oscillograph channels, the method comprising:

initializing channels selected by a user;

assigning the same value to a drawing parameter of each of the initialized channels;

directing each initialized channel to receive a signal from a signal generator and measure a signal voltage of the signal, displaying a waveform chart of the signal voltage of the signal according to the drawing parameter;

determining a initialized channel as a standard channel, calculating a voltage difference between a standard signal voltage of the standard channel and a signal voltage of each of the other initialized channels;

determining a sequence relationship between each of the other initialized channels and the standard channel measuring the signal at the same time according to the calculated voltage difference; and adjusting a deskew value of each of the other initialized channels according to the sequence relationship until each voltage difference is in an allowable range, and outputting the deskew value of each of the other initialized channels.

10. The medium of claim 9, further comprising, after initializing channels selected by a user:

determining if a number of channels selected by the user is less than two, and prompting the user to reselect channels if the number is less than two.

11. The medium of claim 9, wherein the drawing parameter comprises a unit length of a time axis of the waveform chart, a translation amount, a trigger level, and a deskew value of each of the other initialized channels.

12. The medium of claim 9, wherein determination of a sequence relationship between each of the other initialized channels and the standard channel comprises:

determining that a channel measuring the signal is earlier than the standard channel if the voltage difference between the channel and the standard channel is a positive number; and determining that the channel lags behind the standard channel if the voltage difference is a negative number.

\* \* \* \* \*